United States Patent
Morrissey et al.

(10) Patent No.: US 9,484,136 B2
(45) Date of Patent: Nov. 1, 2016

(54) MAGNETIC CORE FOR USE IN AN INTEGRATED CIRCUIT, AN INTEGRATED CIRCUIT INCLUDING SUCH A MAGNETIC CORE, A TRANSFORMER AND AN INDUCTOR FABRICATED AS PART OF AN INTEGRATED CIRCUIT

(71) Applicant: ANALOG DEVICES GLOBAL, Hamilton (BM)

(72) Inventors: Michael Noel Morrissey, Ballingarry (IE); Jan Kubik, Raheen (IE); Shane Patrick Geary, Sixmilebridge (IE); Patrick Martin McGuinness, Pallaskenry (IE); Catriona Marie O'Sullivan, Kilcornan (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 13/927,459

(22) Filed: Jun. 26, 2013

(65) Prior Publication Data

US 2014/0062646 A1    Mar. 6, 2014

Related U.S. Application Data

(60) Provisional application No. 61/696,446, filed on Sep. 4, 2012.

(51) Int. Cl.
*H01F 5/00*       (2006.01)
*H01F 27/28*      (2006.01)
(Continued)

(52) U.S. Cl.
CPC ............. *H01F 3/00* (2013.01); *H01F 27/24* (2013.01); *H01F 27/245* (2013.01); *H01F 27/2804* (2013.01); *H01L 43/02* (2013.01); *H01L 43/12* (2013.01); *H01F 2027/2809* (2013.01)

(58) Field of Classification Search
CPC ....... H01F 27/28; H01F 5/00; H01F 10/3231
USPC ................................... 336/200, 232
See application file for complete search history.

(56) References Cited

U.S. PATENT DOCUMENTS

| 4,025,379 A | 5/1977 | Whetstone |
| 5,583,474 A * | 12/1996 | Mizoguchi et al. ............ 336/83 |

(Continued)

FOREIGN PATENT DOCUMENTS

| CN | 1748006 A | 3/2006 |
| DE | 103 54 694 | 6/2005 |

(Continued)

OTHER PUBLICATIONS

Extended Search Report dated Aug. 11, 2014 for European Patent Application No. 13181339.6, filed Aug. 22, 2013, 8 pages.

(Continued)

*Primary Examiner* — Tsz Chan
(74) *Attorney, Agent, or Firm* — Knobbe, Martens, Olson & Bear, LLP

(57) ABSTRACT

A magnetic core is provided for an integrated circuit, the magnetic core comprising: a plurality of layers of magnetically functional material; a plurality of layers of a first insulating material; and at least one layer of an secondary insulating material; wherein layers of the first insulating material are interposed between layers of the magnetically functional material to form subsections of the magnetic core, and the at least one layer of second insulating material is interposed between adjacent subsections.

26 Claims, 3 Drawing Sheets

(51) Int. Cl.
*H01F 3/00* (2006.01)
*H01L 43/02* (2006.01)
*H01L 43/12* (2006.01)
*H01F 27/24* (2006.01)
*H01F 27/245* (2006.01)

(56) References Cited

U.S. PATENT DOCUMENTS

| | | | |
|---|---|---|---|
| 5,884,990 | A | 3/1999 | Burghartz et al. |
| 6,094,123 | A | 7/2000 | Roy |
| 6,121,852 | A * | 9/2000 | Mizoguchi et al. ............ 333/35 |
| 6,803,848 | B2 | 10/2004 | Yeo et al. |
| 2001/0030591 | A1 | 10/2001 | Gardner |
| 2002/0132136 | A1 * | 9/2002 | Roshen ........................ 428/692 |
| 2004/0195647 | A1 * | 10/2004 | Crawford et al. ............ 257/528 |
| 2005/0105225 | A1 | 5/2005 | Ahn et al. |
| 2005/0156704 | A1 * | 7/2005 | Gardner et al. ............. 336/232 |
| 2006/0261921 | A1 * | 11/2006 | Welzel et al. ................ 336/200 |
| 2008/0043365 | A1 * | 2/2008 | Choi et al. ..................... 360/86 |
| 2008/0151615 | A1 * | 6/2008 | Rodmacq et al. ............ 365/173 |
| 2009/0066300 | A1 | 3/2009 | Lotfi et al. |
| 2012/0197366 | A1 * | 8/2012 | Zeijlemaker et al. ........ 607/116 |
| 2014/0362551 | A1 * | 12/2014 | Moon et al. .................. 361/782 |

FOREIGN PATENT DOCUMENTS

| | | |
|---|---|---|
| EP | 0 902 445 | 3/1999 |
| EP | 1 873 759 A2 | 1/2008 |
| GB | 725372 | 3/1955 |
| JP | 05182842 A * | 7/1993 |
| JP | 2001085419 A * | 3/2001 |

OTHER PUBLICATIONS

Office Action dated Nov. 20, 2015 in Chinese Application No. 201310396059.2, 7 pages.

* cited by examiner

MAGNETIC CORE FOR USE IN AN INTEGRATED CIRCUIT, AN INTEGRATED CIRCUIT INCLUDING SUCH A MAGNETIC CORE, A TRANSFORMER AND AN INDUCTOR FABRICATED AS PART OF AN INTEGRATED CIRCUIT

REFERENCE TO RELATED FILES

The present invention claims the priority benefit under 35 U.S.C. §119(e) of U.S. provisional patent application No. 61/696,446, filed Sep. 4, 2012.

FIELD OF THE INVENTION

The present invention relates to a magnetic core which can be formed within or as part of an integrated circuit, for example on a silicon substrate, and to magnetic components such as transformers and inductors formed within an integrated circuit.

BACKGROUND

It is known that magnetic components, such as inductors and transformers have many uses. For example inductors may be used in the fabrication of filters and resonant circuits, or may be used in switched mode power converters to boost or to reduce an input voltage for the generation of a different output voltage. Transformers may be used in the transfer of power or signals from one part of a circuit to another part of a circuit while providing high levels of galvanic isolation.

These components can be fabricated within an integrated circuit environment. For example it is known that spaced apart conductors forming generally "spiral" or approximations of "spiral" shapes can be formed on a semiconductor substrate to form a transformer. Such spaced apart spiral inductors can be placed in a side by side or in a stacked configuration. However the performance of such transformers is generally limited by the magnetic coupling between the "coils" formed by the spiral conductors. The conductors are surrounded by an insulating material, such as polyimide. This provides the necessary insulating properties to prevent the conductors from being in galvanic connection with one another, but from a magnetic coupling point of view is little better than an "air-gap" Such transformers therefore offer low efficiency and consequently relatively poor power transfer between the windings of the transformer.

It has been known, in the field macro scale transformers, that the coupling between the windings of the transformer, for example between primary and secondary windings of the transformer, can be enhanced by the inclusion of a core of suitable material. The core is generally made of ferromagnetic material. Manufacturers of macro-scale transformers quickly realized that solid metallic cores were inefficient because eddy currents were induced in them, giving rise to resistive losses within the transformer. Manufacturers of macro-scale transformers overcame these eddy current losses by providing the core as a laminate structure of relatively thin sheets of ferromagnetic material separated from one another by insulating layers. In general the working frequency of the transformer could be increased by decreasing the thickness of the laminations.

SUMMARY

According to one aspect of the present invention there is provided a magnetic core for use in an integrated circuit, the magnetic core comprising:

a plurality of layers of magnetically functional material;
a plurality of first insulating layers; and
at least one second insulating layer; wherein the first insulating layers are interposed between layers of the magnetically functional material to form subsections of the magnetic core, and the at least one second insulating layer is interposed between adjacent subsections of the magnetic core.

It is thus possible to form a core where, in some embodiments, laminate regions of magnetic material are separated from one another by insulating regions formed of the second insulating material, which is different from the insulating material between the laminate magnetically functional materials within each subsection.

The use of dissimilar materials, or dissimilar thicknesses of the same insulating material, enables the characteristics of the core to be controlled.

The magnetically functional material can be a soft magnetic material. Advantageously the magnetically functional material is a ferromagnetic material, such as nickel-iron, nickel-cobalt, iron-cobalt, or cobalt-zirconium-tantalum. This list of materials is not exhaustive.

It is desirable that the layers of magnetically functional material be uniform and free from discontinuities or other dislocations therein. The quality of the layers of magnetic material may be enhanced by fabricating them on a suitable growth substrate, which might be thought of as a "seeding layer", which acts to promote correct crystal growth within the magnetically functional layer during deposition. A suitable seeding layer for use with nickel-iron magnetically functional layers is aluminum nitride (AlN). Thus this layer of first insulating material has the effect of controlling the crystal growth within the magnetically active layers, and also forming an insulating layer between adjacent layers of magnetically active material. The thickness of the layers of first insulating material may be varied between several nanometers and several tens of nanometers. For example, the layers of first insulating material can be between 5 nanometers and 30 nanometers. In an example embodiment, the layers of the first insulating material have a nominal thickness of 10 nanometers or so. The layers of magnetically active material can be between about 50 nm and 200 nm, such as about 100 nm.

While such layers of first insulating material provide good insulation for DC and low frequency excitations of the windings of a transformer or inductor, as the frequency increases the relatively thin layers of the first insulating material, for example 10 nanometer thick layers of aluminum nitride, act as a dielectric between adjacent metallic plates, which functionally equates to a capacitor. The existence of such a parasitic capacitor enables an alternating current flow to be established within the laminate structure at higher frequencies, and can thereby reintroduce eddy current losses. However, the provision of the second insulating layer with lower capacitance per unit area, which can be a layer of material with a greater width (or thickness) than the first material and/or a reduced permittivity (which may be expressed as a reduced relative permittivity), disrupts the capacitive coupling between the subsections of the magnetic core. Consequently eddy current flow within the core is reduced and transformer losses are reduced at higher frequencies compared to those structures without such second insulating layer(s) therein. Similarly inductors formed using the magnetic core described herein are less lossy than those formed without such second insulating layer(s).

Advantageously the second insulating layer is formed of a second insulating material that is selected to be compatible with a semiconductor fabrication process so as to avoid additional processing steps. Thus, in a silicon based fabrication process, it is advantageous for the second insulating material to be a semiconductor based material, particularly a silicon based compound. For example, a semiconductor oxide such as silicon dioxide may conveniently be used as the second insulating material. The second insulating material may, as noted before, be deposited in thicker layers than the first insulating material. Such layers may be between a couple of tens of nanometers thick and several hundred nanometers thick. In embodiments of the present invention the second insulating material may be between 20 and 200 nanometers thick. The thickness may in part depend upon the desired working frequency of the device, and a thickness budget for the core set by the manufacturer or designer of the integrated circuit.

Advantageously the core is fabricated on a silicon substrate and circled by first and second windings forming primary and secondary coils of a transformer. The windings may, for example, be generally planar when passing over or beneath the magnetic core, and then may be connected together by way of vias or other interlayer connections within the integrated circuit.

According to a second aspect of the present invention there is provided a method of forming a magnetic core, comprising on a substrate:
a) depositing a first insulating layer;
b) depositing a layer of magnetically functional material;
c) repeating steps a) and b) at least once;
d) depositing a second insulating layer different in at least one of thickness and composition to the first insulating layer;
e) depositing a first insulating layer;
f) depositing a layer of the magnetically functional material;
g) repeating steps e) and f) at least once.

The deposition of the various layers of materials may take place across a specific region of a substrate or may be performed across the entirety of a substrate/wafer. Where the deposition of the various layers is performed across the entirety of a wafer, subsequent masking and etching steps can be performed in order to divide deposited layers across the wafer into various magnetic cores separated from one another. A plurality of integrated circuits may then be formed on the wafer and the wafer may then be diced such that the individual ones of the integrated circuits may then be placed within a suitable packaging in order to form the finished integrated circuit component.

BRIEF DESCRIPTION OF THE DRAWINGS

The present invention will now be described, by way of non-limiting example only, with reference to the accompanying drawings, in which.

DETAILED DESCRIPTION OF EMBODIMENTS

Figure 1:
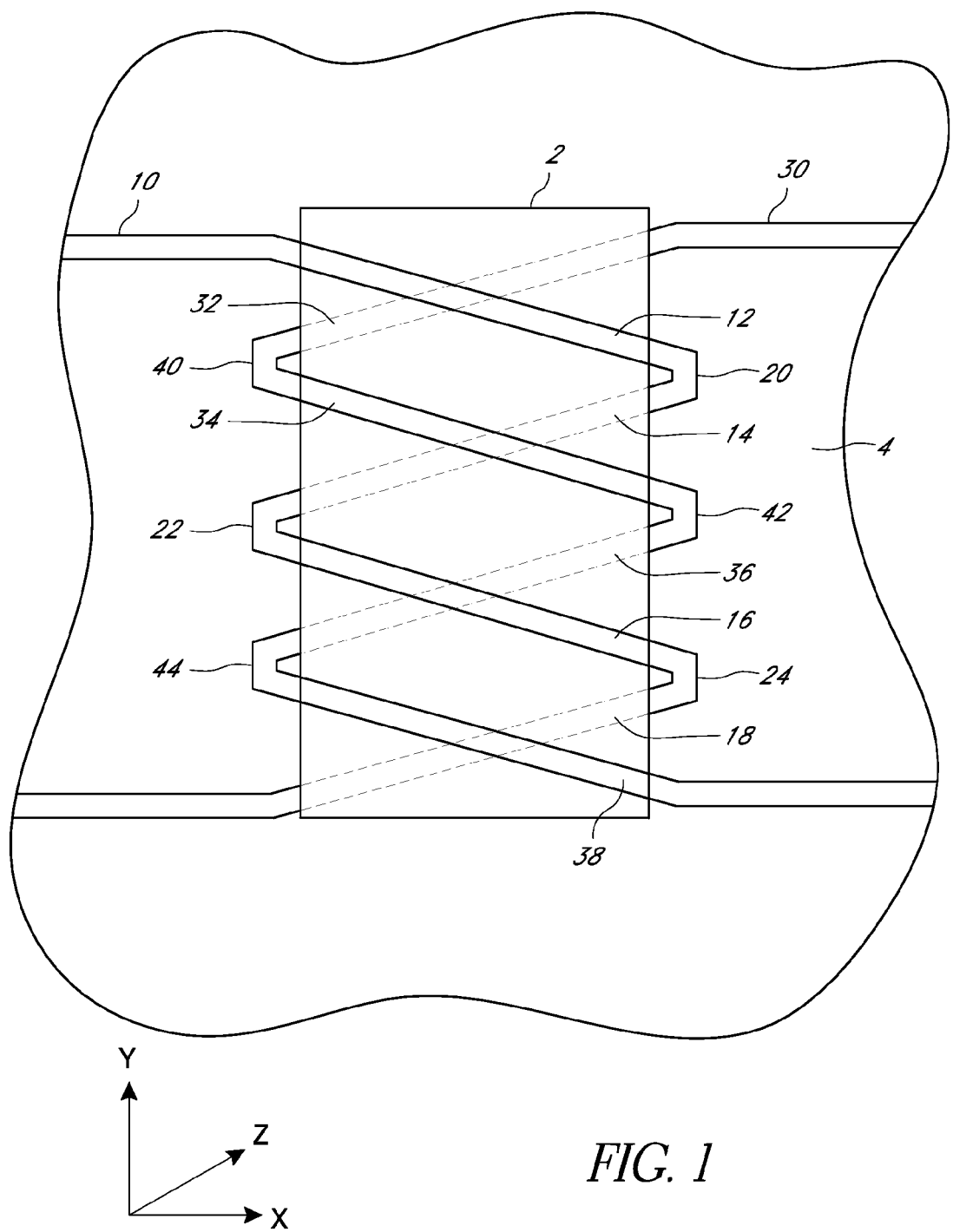
FIG. 1 is a plan view of a portion of a wafer having a transformer formed thereon, the transformer including a magnetic core.

FIG. 1 schematically illustrates an example of a magnetic core, generally indicated by reference number 2, formed above a portion of a substrate 4. Advantageously the substrate 4 is a semiconductor substrate such that other components, such as drive circuitry and receiver circuitry associated with primary and secondary windings of a transformer, may be formed on the substrate 4. However, in some applications non-semiconductor substrate materials may be used for their electrical properties, such as higher impedance. For the purposes of illustration structures around the magnetic core 2, such as layers of insulating material, for example polyimide, have been omitted. Thus the only structures shown in FIG. 1 are the substrate 4, the magnetic core 2, and conductive tracks formed in first and second layers parallel to the plane of the substrate 4 (and also parallel to the plane of FIG. 1) which exist above and below the magnetic core 2. The first layer of conductors can be considered as being above the magnetic core 2 and hence closer to the viewer than the second layer, which lies between the magnetic core 2 and the substrate 4. Conductors passing beneath the magnetic core 2 are shown in chain outline in FIG. 1, while conductors passing above the magnetic core 2 are shown in solid outline. A first winding, for example a primary winding 10, can be formed of linear track sections 12, 14, 16 and 18, where sections 12 and 16 are formed in the first metallic layer and sections 14 and 18 are formed in the second metallic layer, and are connected together by way of vias or equivalent interconnect regions, 20, 22 and 24. A secondary winding 30 may be formed of planar track sections 32, 34, 36 and 38, where sections 34 and 38 are formed in the first metallic layer, and sections 32 and 36 are formed in the second metallic layer, and the sections are connected together by way of vias or other suitable interconnects 40, 42 and 44. It can be seen that the primary and secondary coils are formed as structures that spiral around the magnetic core 2, which are insulated from the core 2, and which are insulated from one another. Thus there is no galvanic path between the primary and secondary winding and the primary mechanism coupling the coils together is a magnetic one. Minor parasitic capacitances may also form signal flow paths between the primary and secondary winding, but these are considerably less significant.

Advantageously the magnetic core 2 exhibits relatively high permeability in order that flux generated by the primary winding 10 is efficiently coupled to the secondary winding 30. This is achieved by the use of ferromagnetic materials within the core 2. However, as is experienced in macro-scale transformers, the magnetic flux generated around the primary winding 10 interacts with the magnetic core 2, and can give rise to eddy currents flowing within the core 2. These eddy currents flow through the resistive material of the core 2 and give rise to a loss mechanism. This reduces the efficiency of the magnetic component, and in the case of transformers may manifest itself as an apparent increase in the coil impedance of the primary winding as the excitation frequency of the primary winding increases.

Drawing on the experience of macro-scale transformers, one way to address the eddy current problem is to segment the core into a plurality of sections which are insulated from one another. Within the context of integrated circuit, it might be thought that the easiest approach would be to etch a series of trenches into the magnetic core, with the longitudinal axis of the trenches running parallel to the direction of the magnetic field generated by the windings, in which case trenches would run from the top of FIG. 1 to the bottom of FIG. 1 (Y direction) so as to divide the core into a plurality of parallel "fingers". In fact, in the micro-scale environment of integrated circuits this approach would be highly disadvantageous as the thin fingers would then exhibit shape anisotropy which would cause the magnetically easy axis of the ferromagnetic material to extend along the Y direction of FIG. 1. This in turn would give rise to large hysteretic losses within the material, which could be avoided by having the magnetically easy direction extend along the X axis (horizontally) of FIG. 1. Such an arrangement would cause the "hard" direction to be parallel with the magnetic field and the Y axis, and this direction generally has a much smaller hysteresis loop and operates in the generally linear region of the hysteresis loop over a much wider range of applied magnetic fields.

However the magnetically easy axis can be maintained along the "X" direction of FIG. 1 if the magnetic core is segmented into a plurality of individual layers, each layer existing in the X-Y plane of FIG. 1. The easy axis can be defined during deposition of the layer of magnetic material. Several techniques are known to the person skilled in the art and need not be described here.

Figure 2:
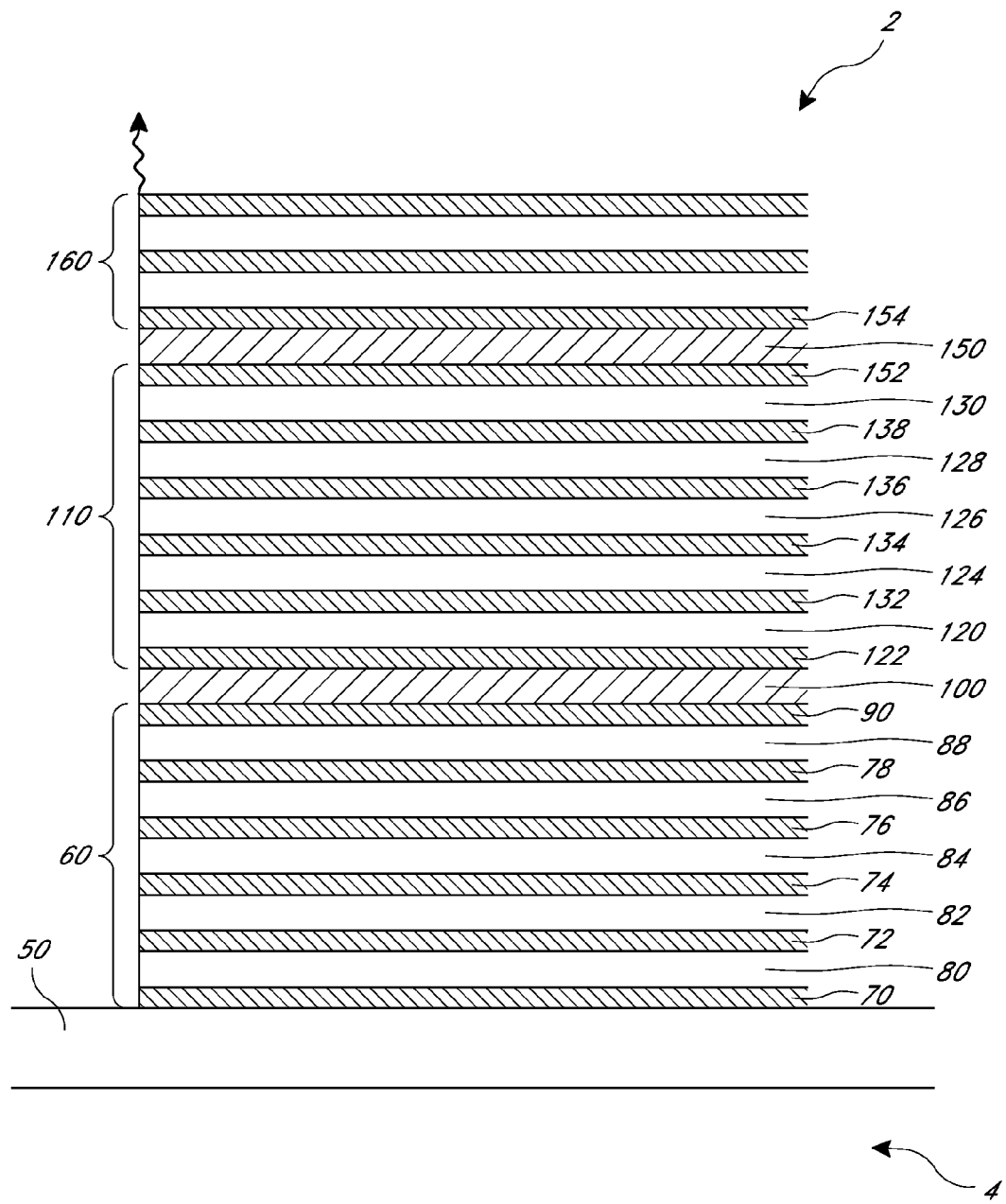
FIG. 2 is a cross section through a magnetic core of the type shown in FIG. 1.

FIG. 2 schematically illustrates a cross section through the magnetic core 2 of FIG. 1. The cross section is perpendicular to the plane of FIG. 1, showing layers stacked in the Z direction working upwards from the substrate 4. FIG. 2 is not drawn to scale and the dimensions of the component layers within the magnetic core 2 are not shown to scale with respect to each other, and neither is the size of the magnetic core 2 shown correctly to scale with respect to the rest of the integrated circuit.

As shown in FIG. 2, the substrate 4 may have one or more layers of material formed on it, generally designated 50, between the substrate 4 and a base layer of the magnetic core 2. The layer 50 may include metallic tracks forming part of the second metallic layer shown in FIG. 1 and may also include one or more layers of insulating material, such as aluminum nitride or polyimide.

The magnetic core 2 comprises a plurality of layers. In general, a first subsection, generally designated 60 of the core 2 comprises layers 70, 72, 74, 76, and 78 of the first insulating material arranged in an alternating sequence with layers 80, 82, 84, 86 and 88 of magnetically functional material. In this example five layers of magnetically functional material sit above five layers of first insulating material in an alternating stack. It should be noted that fewer, or indeed more, layers of magnetically functional material and first insulating material may be used to form the first subsection 60.

A layer 100 of the second insulating material is formed above the first subsection 60 of the magnetic core 2. Alternatively a thicker layer of the first insulating material could be deposited. The layer 100 of second insulating material could be deposited directly onto the uppermost layer 88 of magnetically functional material in the first subsection 60. Alternatively, a barrier layer 90 may be formed between the layer 100 of the second insulating material and the uppermost layer 88 of magnetically functional material. Such a barrier layer is illustrated in FIG. 2. For convenience, the barrier layer 90 may be formed of the first insulating material. A second subsection, generally designated 110, of the magnetic core 2, comprising alternating layers of magnetically functional material and the first insulating material as described hereinbefore, is formed above the layer 100. A lowermost layer 120 of magnetically functional material could be deposited directly on to the layer 100 of the second insulating material. However, in an embodiment of the invention a layer 122 of the first insulating material is formed above the layer 100 of the second insulating material, and acts as a seed layer for the layer 120 of magnetically functional material. Thus, as shown in FIG. 2 layer 100 of the second insulating material is bounded on its upper and lower faces by layers of the first insulating material. This can have the further advantage of, for example, stopping degradation of the magnetically active material in the layers 88 and 120 occurring when, for example, the layer 100 is made out of an oxide, such as silicon dioxide.

The second subsection 110 comprises five layers of magnetically functional material 120, 124, 126, 128 and 130 with each adjacent layer of magnetically functional material being separated from an adjacent layer of magnetically functional material by a layer 132, 134, 136 and 138 of the first insulating material.

The uppermost layer of magnetically functional material 130 of the second subsection 110 is bounded by a second layer 150 of the second insulating material. As before, the layer 150 of the second insulating material may be sandwiched between layers 152 and 154 of the first insulating material. As an alternative to depositing the layer of second insulating material, a layer of first insulating material having an increased thickness (compared to layers in the subsections) could be deposited. A third subsection 160 of the core 2 is formed above the second subsection 110. This process can be continued until an uppermost portion of the magnetic core 2 is reached, where the final two layers may comprise a layer of magnetically functional material topped by a layer of the first insulating material. Thus, if the magnetic core is made of two subsections, only one layer of the second insulating material can be provided to separate the subsections. If the magnetic core is made of three subsections, then two layers of the insulating material can be provided to separate the subsections. In general it can be seen that if the magnetic core is made of N subsections, then N−1 layers of the second insulating material can be provided.

In the example given each of the subsections comprises five layers of magnetically functional material. In general, each subsection does not have to be identical to the other subsections although such an arrangement has been described here. Similarly each subsection does not need to comprise five layers of magnetically functional material. In an embodiment of a core as shown in FIG. 2, the layers of the first insulating material may be aluminum nitride (although other insulating materials such as aluminum oxide may be used for some or all of the layers of first insulating material), and have thicknesses of approximately 10 nanometers, although other thicknesses can be used and it is envisaged that the first layers could typically have a thickness range of between 5 and 30 nanometers. The magnetically active layers can be formed of nickel-iron or nickel-cobalt and typically have a thickness of around 100 nanometers although thinner or thicker layers, for example in the range of 50 to 200 nanometers thick may be used. The second insulating layer may be arranged such that capacitive coupling between the subsections is reduced compared to capacitive coupling between adjacent layers of magnetic material in a subsection, by virtue of one or both of an increased separation between the uppermost magnetically functional layer of one subsection, and the lowermost magnetically functional layer of the next subsection, and reduced permittivity of the second insulating material relative to the first insulating material.

Aluminum nitride has a relative permittivity of about 8.5, whereas as silicon dioxide has a relative permittivity of about 3.9.

It is believed that this reduced capacitive coupling between subsections reduces the eddy current flow through the magnetic core as a whole, and hence reduces core losses. In trials, cores made entirely of alternating layers of the magnetically active material and the first insulating layer exhibited more significant losses than cores made as described herein with respect to FIG. 2. Thus the inclusion of the additional insulating layers every now and again within the transformer core was seen to significantly improve the core performance as the frequency increased compared to cores where the layers of second insulating material were omitted.

Figure 3:
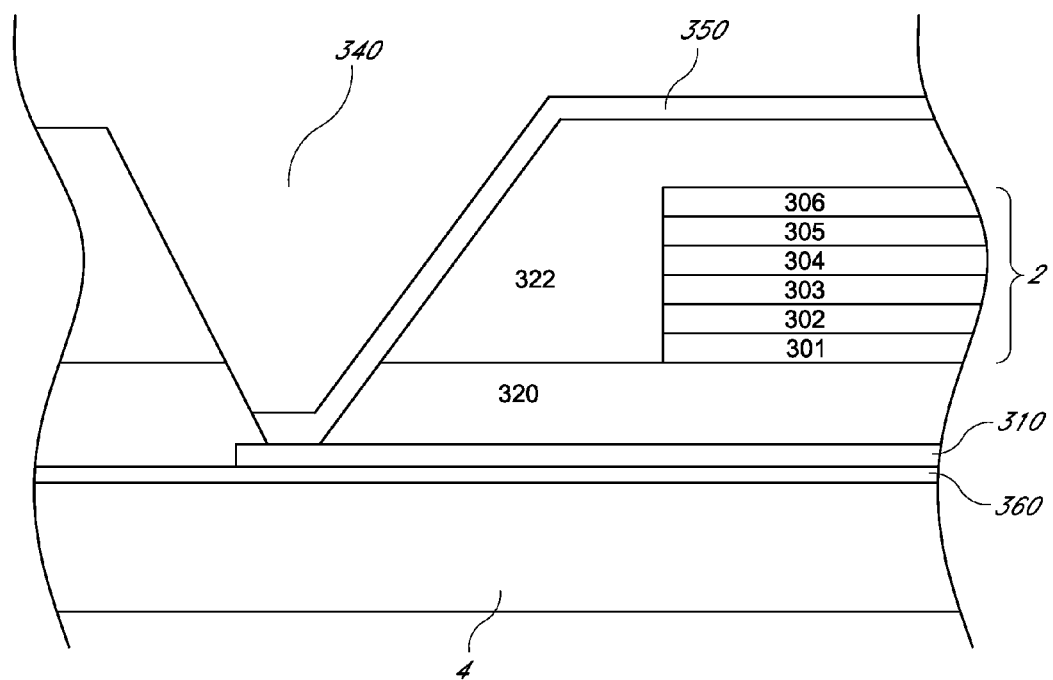
FIG. 3 is a cross section through an integrated circuit constituting an embodiment of the invention.

FIG. 3 is a schematic cross section through an integrated circuit including a transformer having a magnetic core, generally indicated 2, constituting an embodiment of the invention. The magnetic core 2 shown in FIG. 3 is divided into six subsections 301 to 306 by intervening layers of the second insulating material. Each subsection is, as before, comprised of alternating layers of the first insulating material and magnetically functional material.

As shown in FIG. 3, the integrated circuit comprises a substrate 4 which has a lowermost metallic layer 310 deposited thereon. After deposition, the metallic layer 310 is masked and etched so as to form conductive tracks, some of which act to form tracks 14, 18, 32 and 36 of FIG. 1 which constitute part of the primary and secondary windings 10, 30. An insulating layer 320, for example of polyimide, is then deposited above the metal layer 310 to insulate the magnetic core from the transformer windings. The transformer layers 301-306 are then deposited, for example by deposition across the entirety of the substrate. The structure is then masked and then etched so as to form isolated transformer core regions above the insulating layer 320. Additional insulating material may then be deposited to fill in the gaps between adjacent transformer cores 2 and to overlie the cores to encapsulate them within a dielectric. Such an insulating layer is designated as 322 in FIG. 3. The insulating layer 322 may then be subject to planarizing in order to form a substantially flat upper surface of the integrated circuit. This surface may then be masked and etched in order to form depressions 340 in the insulating layer 322 and layer 320 which extend down to the lowermost metallic layer 310. The upper surface may then have a metallic layer 350 deposited on it. The metal also deposits into the V shaped depressions 340 thereby forming interconnections between the lowermost metallic layer 310 and the uppermost metallic layer 350. The layer 350 can then be masked and etched in order to form, amongst other things, the conductive tracks 12, 16, 34 and 38 shown in FIG. 1 constituting parts of the primary and secondary windings 10, 30.

The lowermost metallic layer 310 may be formed over an insulating layer 360 for example of silicon dioxide, which may itself overlie various semiconductor devices (not shown) formed by implantation of donor or acceptor impurities into the substrate 4. As known to the person skilled in the art, apertures may be formed in the insulating layer 360 prior to depositing the first metallic layer 310 in order to form device interconnections between the various circuit components.

It is thus possible to provide an improved magnetic core within an integrated circuit environment such that inductors and transformers can be formed more compactly, due to the use of the magnetic core, while reducing eddy current losses at higher frequencies compared to solid cores, or cores having a laminate structure consisting solely of layers of aluminum nitride of approximately 10 nanometers thick alternating with layers of nickel-iron of approximately 100 nanometers thick.

What is claimed is:

1. A magnetic core for use in an integrated circuit, the magnetic core comprising:

a plurality of subsections, wherein each subsection of the plurality of subsections comprises a plurality of layers of magnetically functional material, and first insulating layers, wherein each of the first insulating layers is formed of a first insulating material, and wherein adjacent layers of the first insulating layers are interposed between adjacent layers of the layers of the magnetically functional material in each subsection of the plurality of subsections; and at least one second insulating layer formed of a second insulating material and interposed between adjacent subsections of the plurality of subsections, wherein the second insulating material is different from the first insulating material, and wherein the magnetic core is a single magnetic core that includes the plurality of subsections and the at least one second insulating layer.

2. A magnetic core as claimed in claim 1, in which a thickness of the at least one second insulating layer is greater than a thickness of a first insulating layer.

3. A magnetic core as claimed in claim 1, in which the first insulating material acts as a growth substrate for the formation of the magnetically functional material.

4. A magnetic core as claimed in claim 3, in which the first insulating material is an insulating nitride.

5. A magnetic core as claimed in claim 1, in which the first insulating material is aluminum nitride or aluminum oxide.

6. A magnetic core as claimed in claim 1, in which a plurality of layers of magnetically functional material are arranged in an alternating sequence with the first insulating layers to form a subsection of the plurality of subsections.

7. A magnetic core as claimed in claim 1, in which at least one second insulating layer is bounded on a first side by one of the first insulating layers.

8. A magnetic core as claimed in claim 7, in which the at least one second insulating is bounded on a second side by a layer of the first insulating layers.

9. A magnetic core as claimed in claim 1, in which the at least one second insulating layer comprises N-1 second insulating layers, the plurality of subsections comprises N subsections, and the N-1 second insulating layers are disposed in the magnetic core so as to divide the magnetic core into N subsections.

10. A magnetic core as claimed in claim 9, in which the plurality of subsections each comprise substantially equal numbers of layers of magnetically active material.

11. A magnetic core as claimed in claim 1, in which the magnetically functional material is a ferromagnetic material.

12. A magnetic core as claimed in claim 11, in which the ferromagnetic material is magnetically soft.

13. A magnetic core as claimed in claim 1, in which the magnetically functional material is a combination of nickel and iron, or iron and cobalt, or nickel and cobalt or cobalt, zirconium and tantalum.

14. A magnetic core as claimed in claim 1, in which the second insulating material is a silicon compound.

15. A magnetic core as claimed in claim 1, in which the second insulating material is a semiconductor oxide.

16. A magnetic core as claimed in claim 1, in which capacitive coupling between the adjacent subsections is reduced compared to capacitive coupling between adjacent layers of the magnetically functional material in a subsection of the adjacent subsections.

17. A semiconductor substrate having a magnetic core as claimed in claim 1.

18. An integrated circuit including a magnetic core as claimed in claim 1.

19. A transformer comprising a magnetic core as claimed in claim 1.

20. An inductor including a magnetic core a magnetic core as claimed in claim 1.

21. A magnetic core, as claimed in claim 1, wherein the at least one second insulating layer comprises two second insulating layers, and wherein a subsection of the plurality of subsections is disposed between the two second insulating layers.

22. A magnetic core comprising:
   a plurality of subsections, wherein each subsection of the plurality of subsections comprises a plurality of layers of magnetically functional material and first insulating layers, wherein each of the first insulating layers is formed of a first insulating material, and wherein adjacent layers of the first insulating layers are interposed between adjacent layers of the layers of the magnetically functional material in each subsection of the plurality of subsections; and
   at least one second insulating layer formed of a second insulating material and interposed between adjacent subsections of the plurality of subsections, wherein the second insulating material is different from the first insulating material and a permittivity of the second insulating material, is less than a permittivity of the first insulating material, and wherein the magnetic core is a single magnetic core that includes the plurality of subsections and the at least one second insulating layer.

23. A magnetic core for use in an integrated circuit, the magnetic core comprising:
   layers of magnetically functional material;
   first insulating layers formed of a first insulating material; and
   two second insulating layers formed of a second insulating material, wherein the second insulating material is different than the first insulating material;
   wherein the magnetic core comprises a subsection between the two second insulating layers, wherein the subsection comprises two or more layers of the magnetically functional material that are each interposed between layers of the first insulating layers, and wherein capacitive coupling between the subsection and an adjacent subsection of the magnetic core is reduced compared to capacitive coupling between adjacent layers of the magnetically functional material of the subsection.

24. A magnetic core as claimed in claim 23, wherein a permittivity of the second insulating material is less than a permittivity of the first insulating material.

25. A magnetic core as claimed in claim 23, further comprising two additional subsections.

26. A magnetic core as claimed in claim 23, wherein the two second insulating materials each has a thickness that is greater than a thickness of any of the first insulating layers.

* * * * *